(12) United States Patent
Wu et al.

(10) Patent No.: US 11,043,945 B2
(45) Date of Patent: Jun. 22, 2021

(54) CAPACITANCE-VARIABLE PRESSURE SENSOR

(71) Applicants: Yingchao Wu, Guangdong (CN); Song Chen, Guangdong (CN); Hang Luo, Guangdong (CN)

(72) Inventors: Yingchao Wu, Guangdong (CN); Song Chen, Guangdong (CN); Hang Luo, Guangdong (CN)

( * ) Notice: Subject to any disclaimer, the term of this patent is extended or adjusted under 35 U.S.C. 154(b) by 196 days.

(21) Appl. No.: 16/361,220

(22) Filed: Mar. 22, 2019

(65) Prior Publication Data

US 2020/0304123 A1 Sep. 24, 2020

(51) Int. Cl.
*H03K 17/955* (2006.01)
*G06F 3/0354* (2013.01)
*H05K 1/02* (2006.01)

(52) U.S. Cl.
CPC ....... *H03K 17/955* (2013.01); *G06F 3/03545* (2013.01); *H05K 1/028* (2013.01)

(58) Field of Classification Search
CPC ......... H03K 17/955; H03K 2217/9651; H03K 17/975; H05K 1/028; G06F 3/03545; G01L 9/12
USPC ........................................................ 324/686
See application file for complete search history.

(56) References Cited

U.S. PATENT DOCUMENTS

| | | | | |
|---|---|---|---|---|
| 5,438,275 A * | 8/1995 | Fado | ................. | G06F 3/03545 324/662 |
| 6,191,933 B1 * | 2/2001 | Ishikaki | ............... | H05K 3/3426 361/309 |
| 7,202,862 B1 * | 4/2007 | Palay | .................. | G06F 3/03545 178/18.01 |
| 8,304,671 B2 * | 11/2012 | Fukushima | ......... | G06F 3/03545 178/19.03 |
| 8,525,530 B2 * | 9/2013 | Fukushima | ......... | G06F 3/03545 324/661 |
| 8,913,041 B2 * | 12/2014 | Fukushima | ........... | G06F 3/0416 345/179 |
| 9,086,267 B2 * | 7/2015 | Ahmad | ..................... | G01L 1/06 |
| 9,183,989 B2 * | 11/2015 | Obata | ................. | G06F 3/03545 |
| 9,513,721 B2 * | 12/2016 | Stern | ..................... | G06F 3/0442 |
| 9,702,778 B2 * | 7/2017 | Horie | .................... | G06F 3/0383 |
| 9,766,725 B2 * | 9/2017 | Hou | ......................... | G01L 1/18 |
| 10,318,022 B2 * | 6/2019 | Mishalov | ............ | G06F 3/03545 |
| 2001/0012384 A1 * | 8/2001 | Kalnitsky | ........... | H01L 27/0248 382/124 |

(Continued)

*Primary Examiner* — Christopher P McAndrew (57) ABSTRACT

A capacitance-variable pressure sensor is disclosed. The capacitance-variable pressure sensor includes a double layer flexible circuit board, a multi-layer ceramic capacitor, and a soft conductive pad. The multi-layer ceramic capacitor is positioned in adjacent to the soft conductive pad. The double layer flexible circuit board is configured with a through hole or a notch, and is positioned between the multi-layer ceramic capacitor and the soft conductive pad. The multi-layer ceramic capacitor is positioned above the through hole or notch, and the soft conductive pad is positioned under the through hole or notch. The multi-layer ceramic capacitor includes a first member and a second member. The first member includes an external electrode or a plurality of external electrodes. The second member includes a ceramic dielectric, and a plurality of internal electrode layers disposed inside the ceramic dielectric. Each external electrode is connected to internal electrode layers.

14 Claims, 11 Drawing Sheets

(56) References Cited

U.S. PATENT DOCUMENTS

| | | | | |
|---|---|---|---|---|
| 2001/0038384 | A1* | 11/2001 | Fukushima | G06F 3/03545 345/179 |
| 2002/0112526 | A1* | 8/2002 | Mattes | B60R 21/0136 73/12.09 |
| 2003/0076310 | A1* | 4/2003 | Kanzaki | G06F 3/03545 345/179 |
| 2004/0261251 | A1* | 12/2004 | Schindel | H05K 1/16 29/595 |
| 2006/0075823 | A1* | 4/2006 | Grudzien | G01L 9/0072 73/718 |
| 2006/0191351 | A1* | 8/2006 | Meehan | G01L 9/0072 73/780 |
| 2013/0193532 | A1* | 8/2013 | Horie | G01L 9/12 257/415 |
| 2014/0069532 | A1* | 3/2014 | Obata | G01L 1/148 137/554 |
| 2016/0313839 | A1* | 10/2016 | Hou | G06F 3/0383 |

* cited by examiner

CAPACITANCE-VARIABLE PRESSURE SENSOR

BACKGROUND OF THE INVENTION

The present invention relates to a sensor, and particularly, to a capacitance-variable pressure sensor.

Capacitance-variable sensor is often adopted serving as a pressure sensor in an electronic pen. A capacitance-variable sensor is in fact a plate capacitor typically consisting of a deformable flexible electrode, a metal electrode, a dielectric medium and an insulation pad. The deformable flexible electrode and the metal electrode serve as two electrodes of the plate capacitor. The metal electrode shall stay adherent to the dielectric medium, so as to avoid introduction of air therebetween and thus assuring the performance of the sensor. The insulation pad is positioned between deformable flexible electrode and the dielectric medium, and is often configured with a through hole, so as to leave an air gap between the deformable flexible electrode and the dielectric medium. The working principle can be learnt by referring to U.S. Pat. No. 5,206,785, and many applications were disclosed by, for example, U.S. Pat. No. 6,853,369B2, Chinese Patents CN101009158B, CN101393491B, and CN102419672B.

Conventionally, both electrodes of the pressure sensor employed in an electronic pen have to physically connected to measuring circuits. To make the physical connection reliable, very precise plastic molding along with fine metal electrode, and very precise assembly are required. However, this also makes the fabrication process complicated and inefficient. In addition, the metal electrode is closely positioned in contact with the dielectric medium, and air is not allowed existing therebetween. In application, it is often achieved by directly coating a metal layer on one side of the dielectric medium, which is very complicate in processing and also increase the production cost.

BRIEF SUMMARY OF THE INVENTION

To overcome the defects of the conventional technologies, the present invention provides a capacitance-variable pressure sensor which is cost-effective, simple structure, and convenient for fabrication.

The present invention provides a capacitance-variable pressure sensor. The capacitance-variable pressure sensor includes a double layer flexible circuit board, a multi-layer ceramic capacitor, and a soft conductive pad. The multi-layer ceramic capacitor is positioned in adjacent to the soft conductive pad. The double layer flexible circuit board is configured with a through hole or a notch, and is positioned between the multi-layer ceramic capacitor and the soft conductive pad. The multi-layer ceramic capacitor is positioned above the through hole or notch, and the soft conductive pad is positioned under the through hole or notch. The multi-layer ceramic capacitor includes a first member and a second member. The first member includes an external electrode or a plurality of external electrodes. The second member includes a ceramic dielectric, and a plurality of internal electrode layers disposed inside the ceramic dielectric. Each external electrode is connected to internal electrode layers. When an external pressure is applied, the soft conductive pad deforms so that at least a part of the soft conductive pad moves through the through hole or notch to contact the ceramic dielectric. When the external pressure varies, the contact area of the soft conductive pad with the ceramic dielectric varies accordingly, thus the capacitance between the soft conductive pad and the external electrode(s) of the multi-layer ceramic capacitor varies accordingly.

According to an aspect of the present invention, the double layer flexible circuit board includes an upper conductive layer, a lower conductive layer, and an insulation layer disposed between and insulating the upper conductive layer and the lower conductive layer.

According to an aspect of the present invention, the external electrode(s) of the multi-layer ceramic capacitor is/are electrically connected to the upper conductive layer.

According to an aspect of the present invention, when applied with the external pressure, the soft conductive pad is electrically connected to the lower conductive layer.

According to an aspect of the present invention, the through hole or the notch is configured penetrating through the upper conductive layer, the insulation layer, and the lower conductive layer.

According to an aspect of the present invention, the double layer flexible circuit board is configured with an L-shape cross-section.

According to an aspect of the present invention, the capacitance-variable pressure sensor further includes a pressure application member adopted for applying the external pressure on the soft conductive pad. The pressure application member includes a bump. The bump is adopted for physically applying the external pressure on the soft conductive pad.

According to an aspect of the present invention, the double layer flexible circuit board is electrically connected to a measuring circuit.

According to an aspect of the present invention, two external electrodes are included, and are respectively positioned at two lateral sides of the multi-layer ceramic capacitor.

According to a further aspect of the present invention, the internal electrode layers respectively connected with the two external electrodes are disposed in an interlacing manner inside the multi-layer ceramic capacitor.

The capacitance-variable pressure sensor of the present invention has the following advantages:

1. Non-electrode parts of a multi-layer ceramic capacitor are all dielectric materials, and the present invention substitutes the conventional dielectric medium in capacitance-variable sensor with the non-electrode parts of the multi-layer ceramic capacitor, thus saving the cost.

2. Internal electrode layers and the dielectric medium of a multi-layer ceramic capacitor is essentially adherent with each other, and the present invention takes the advantage of this feature in that the metal coating process on the dielectric medium is not needed, thus further saving the cost.

3. The present invention uses the insulation layer of the double flexible circuit board serving as the function of the insulation pad of the conventional variable capacitor sensor, and thus saving elements and simplifying the assembly process.

4. The dielectric mediums used in electronic pens are typically very small, and the metal of the coated electrodes are very thin, and therefore when assembled in the electronic pens, electrical connection with the coated electrodes is a great challenge. Directly soldering onto the coated electrodes is almost not feasible. A conventional solution is to employ a particular oxidation resisting metal member to remain tightly contact with the coated electrode. The present invention provides a simplified solution in that the conductive layers of the double layer flexible circuit board are electrically connected to the external electrode(s) of the multi-layer ceramic capacitor. Such an electrical connection can be conveniently achieved by tin soldering, which is simple, convenient, and reliable.

5. The present invention employs a double layer flexible circuit board, which is bendable and therefore the present invention allows very flexible connection of the capacitance-variable sensor with the measuring circuit, and suitable for massive fabrication.

6. The deformable flexible electrode of the conventional technology is typically made of conductive rubber or conductive silicon, and soldering process is not applicable for electrical connection with the conductive rubber or conductive silicon. A conventional solution is to employ a particular oxidation resisting metal member to remain tightly contact with the deformable flexible electrode. The present invention employs conventional oxidation resisting surface treatment process of flexible circuit board, e.g., gold plating, nickel plating or gold deposition, to achieve the reliable electrical connection with the soft conductive pad, which is simple, convenient, and saving cost.

These and other features, aspects, and advantages of the present invention will become better understood with regard to the following description, appended claims, and accompanying drawings.

DETAILED DESCRIPTION OF THE INVENTION

The present invention provides a capacitance-variable pressure sensor. Referring to FIGS. 1 to 12, the capacitance-variable pressure sensor includes a double layer flexible circuit board 1, a multi-layer ceramic capacitor 3, a soft conductive pad 4, and a pressure application member 5. The multi-layer ceramic capacitor 3 is positioned in adjacent to the soft conductive pad 4. The double layer flexible circuit board 1 is configured with a through hole or a notch 13, and is positioned between the multi-layer ceramic capacitor 3 and the soft conductive pad 4. The multi-layer ceramic capacitor 3 is positioned above the through hole or notch 13, and the soft conductive pad 4 is positioned under the through hole or notch 13. The multi-layer ceramic capacitor 3 includes a first member and a second member. The first member includes an external electrode 31 or a plurality of external electrodes 31. The second member includes a ceramic dielectric 33, and a plurality of internal electrode layers 32 disposed inside the ceramic dielectric 33. Each external electrode 31 is connected to internal electrode layers 32. The pressure application member 5 is disposed beneath the soft conductive pad 4. When an external pressure is applied to the bottom of the pressure application member 5, the pressure application member transfers the pressure to the soft conductive pad 4, and the soft conductive pad 4 deforms and thus varying a contact area between the ceramic dielectric 33 and the soft conductive pad 4, and the capacitance between the soft conductive pad 4 and the external electrode(s) of the multi-layer ceramic capacitor 31 varies accordingly.

According to an embodiment of the present invention, the capacitance-variable pressure sensor is employed in an electronic pen, and the core of the electronic pen serves as the pressure application member 5. When the electronic pen is in writing, the core is applied with a pressure from the medium on which the electronic pen is writing, and then the pressure is transferred to the soft conductive pad 4. The contact area between the soft conductive pad 4 and the ceramic dielectric 33 varies, and the capacitance between the soft conductive pad 4 and the external electrode(s) of the multi-layer ceramic capacitor 31 varies accordingly. In addition, the contact area and the capacitance varies in accordance with different pressure applied to the core.

According to another embodiment of the present invention, the double layer flexible circuit board 1 is connected to an external measuring circuit to output the capacitance value to the external measuring circuit. The external measuring circuit is adopted for retrieving the pressure applied to the core by calculating the capacitance value.

According to an embodiment of the present invention, the double layer flexible circuit board 1, the multi-layer ceramic capacitor 3, the soft conductive pad 4, and the pressure application member 5 are all enveloped in a pen shell 2.

According to an embodiment of the present invention, the external electrode(s) 31, the soft conductive pad 4, are electrically connected to the double layer flexible circuit board 1, and by which capacitance between the external electrode(s) 31 of the multi-layer ceramic capacitor 3 and the soft conductive pad 4 are output to the external measuring circuit for processing.

According to an embodiment of the present invention, the double layer flexible circuit board 1 is configured with a double layer structure. As shown in FIGS. 8 to 11, the double layer flexible circuit board 1 includes an upper conductive layer 11, an insulation layer 12, and a lower conductive layer 14. The upper conductive layer 11 is positioned above and glued to the insulation layer 12, and the lower conductive layer 14 is positioned under and glued to the insulation layer 12, so that the insulation layer 12 is sandwiched between the upper conductive layer 11 and the lower conductive layer 14. One or more external electrode(s) 31 of the multi-layer ceramic capacitor 3 is/are electrically connected to the upper conductive layer 11 by physical contact/fastening or soldering, or adhesion. The soft conductive pad 4, when applied with an external pressure, is electrically connected to the lower conductive layer 14. When the external pressure is not applied, or withdrawn, the soft conductive pad 4 is not necessarily connected to the lower conductive layer 14.

According to an embodiment of the present invention, the insulation layer 12 is a plate-type insulation material.

According to an embodiment of the present invention, the upper conductive layer 11 and the lower conductive layer 14 are electrically connected to corresponding elements respectively by physical contact or soldering.

According to an embodiment of the present invention, the through hole or the notch 13 is configured through the upper conductive layer 12, the insulation layer 11, and the lower conductive layer 14, so as to configure an air gap between the soft conductive pad 4 and the ceramic dielectric 33.

According to an embodiment of the present invention, the capacitance-variable pressure sensor is adopted to be employed in an electronic pen, and the double layer flexible circuit board 1 is configured with an L-shaped cross-section.

According to an embodiment of the present invention, the pressure application member 5 is configured with a bump at its upper end. When the external pressure is applied to the pressure application member 5, the bump transfers the external pressure onto the soft conductive pad. In application, the soft conductive pad 4 is configured with a contact member corresponding to the bump for receiving the external pressure transferred from the bump. The contact member can be configured with a hemispherical shape, or a triangular shape, or a trapezoid shape or the like.

According to an embodiment of the present invention, a plurality of external electrodes 31 are employed, and the external electrodes 31 can be respectively selected serving as an output electrode of the capacitance-variable pressure sensor which is connected to the upper layer 11, or alternatively connected each other and as a whole serving as the output electrode.

Figure 1:
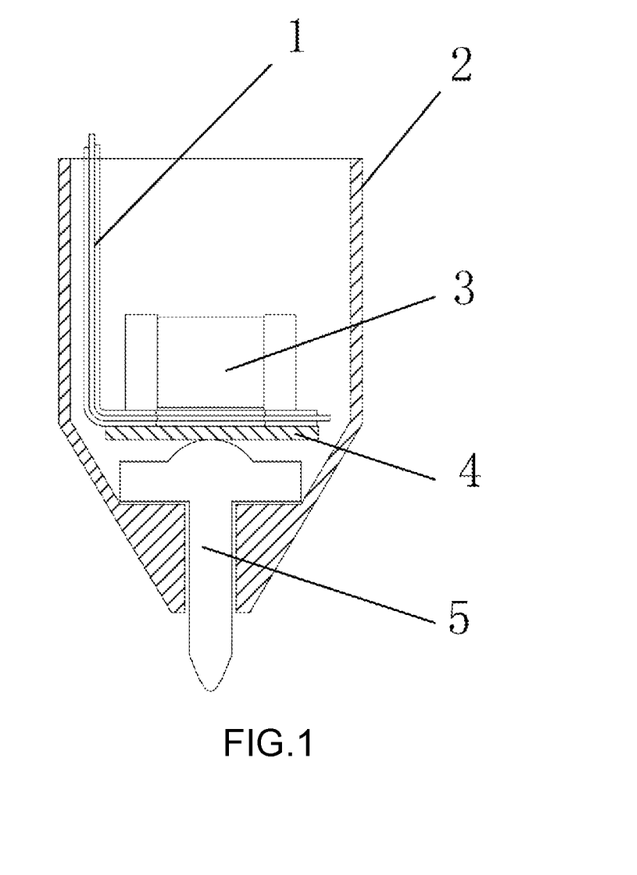
FIG. 1 is a cross-sectional view of a capacitance-variable pressure sensor employed in an electronic pen, demonstrating the status of the capacitance-variable pressure sensor when the electronic pen is not writing.
Figure 2:
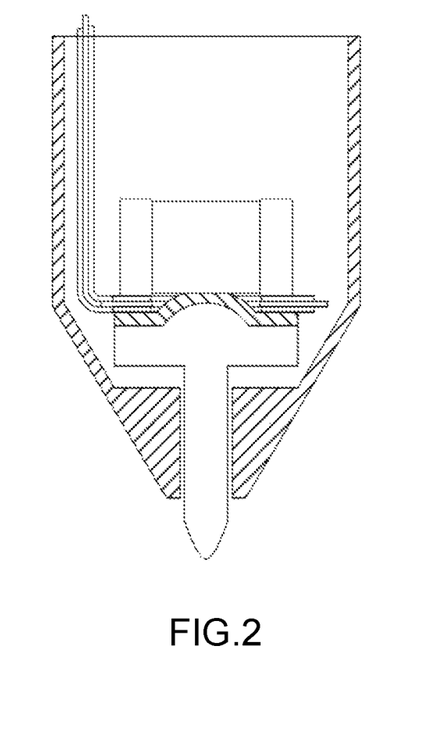
FIG. 2 is a cross-sectional view of a capacitance-variable pressure sensor employed in an electronic pen, demonstrating the status of the capacitance-variable pressure sensor when the electronic pen is writing.
Figure 3:
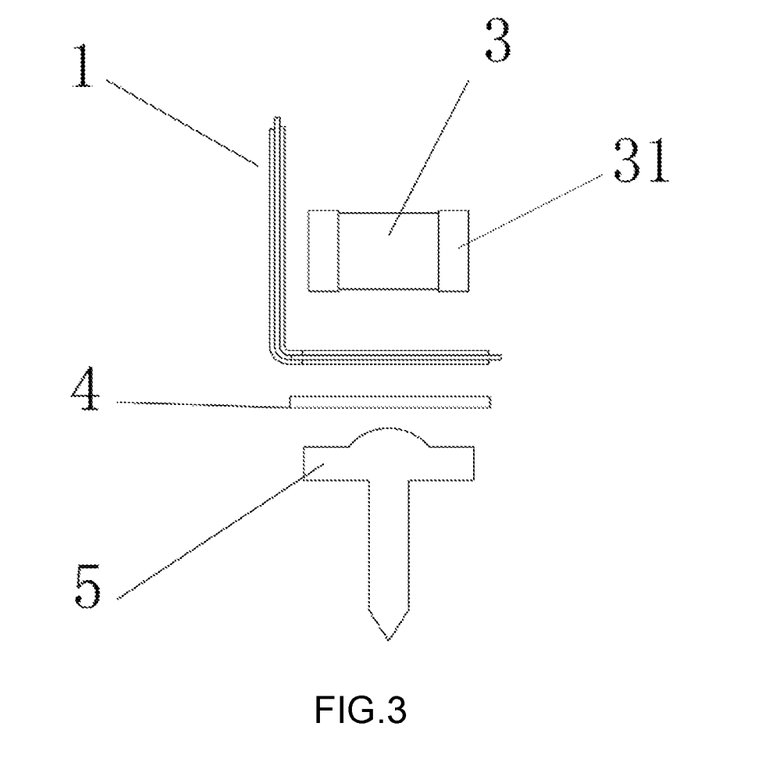
FIG. 3 is an explosive view of the capacitance-variable pressure sensor.
Figure 4:
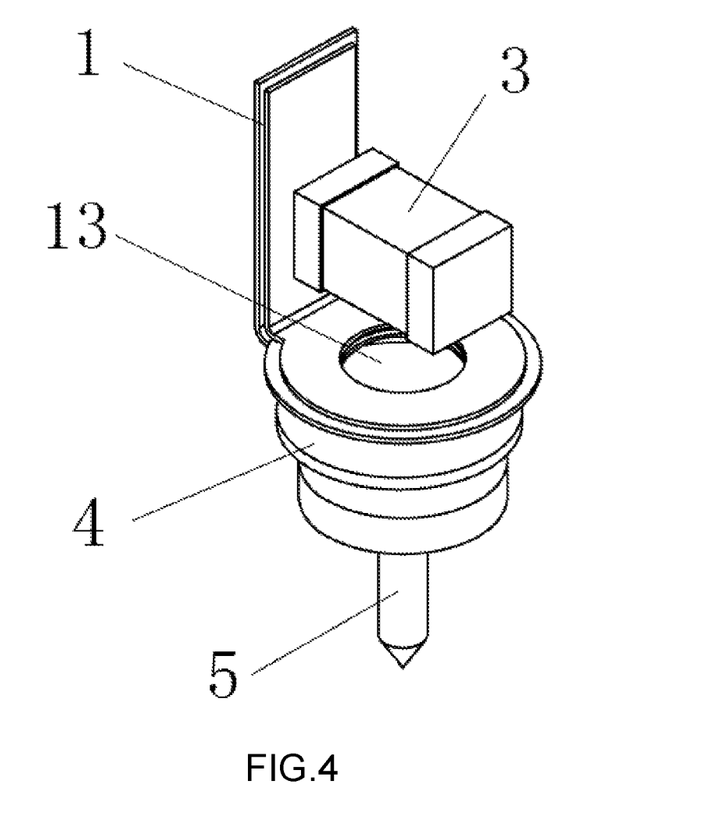
FIG. 4 is a structural diagram illustrating the capacitance-variable pressure sensor of the present invention.
Figure 5:
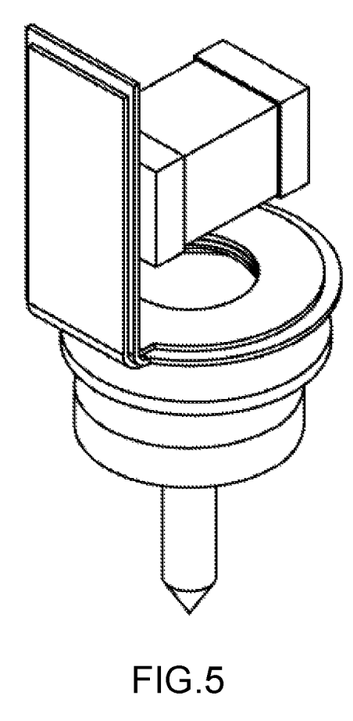
FIG. 5 is another structural diagram illustrating the capacitance-variable pressure sensor of the present invention.
Figure 6:
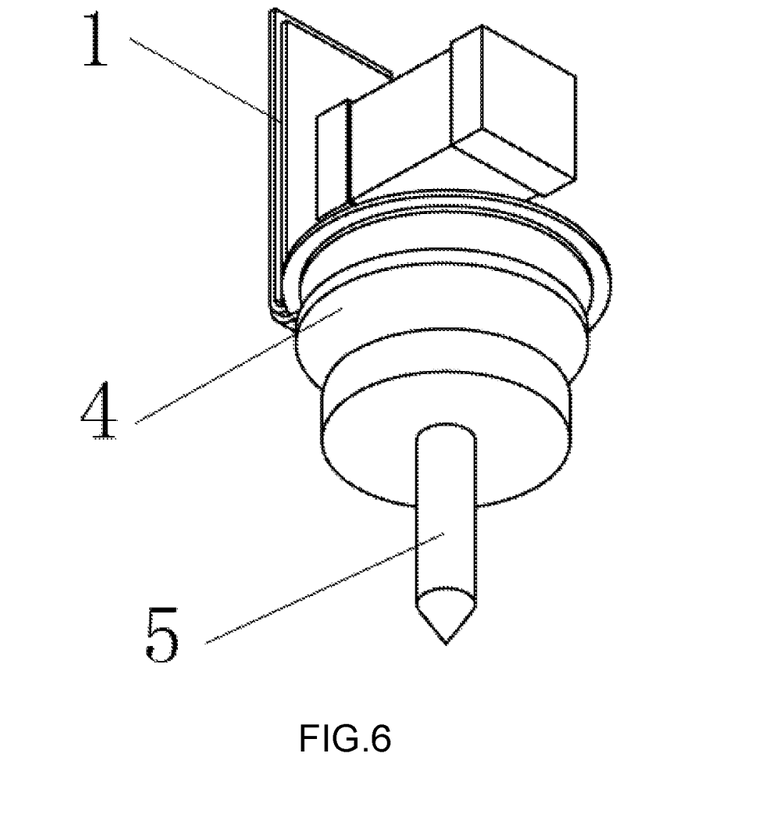
FIG. 6 is a further structural diagram illustrating the capacitance-variable pressure sensor of the present invention.
Figure 7:
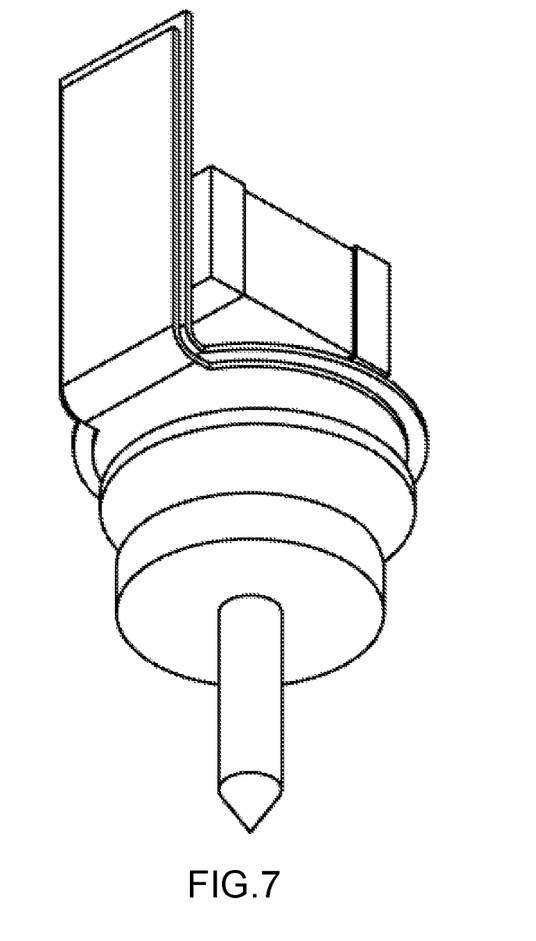
FIG. 7 is still another structural diagram illustrating the capacitance-variable pressure sensor of the present invention.
Figure 8:
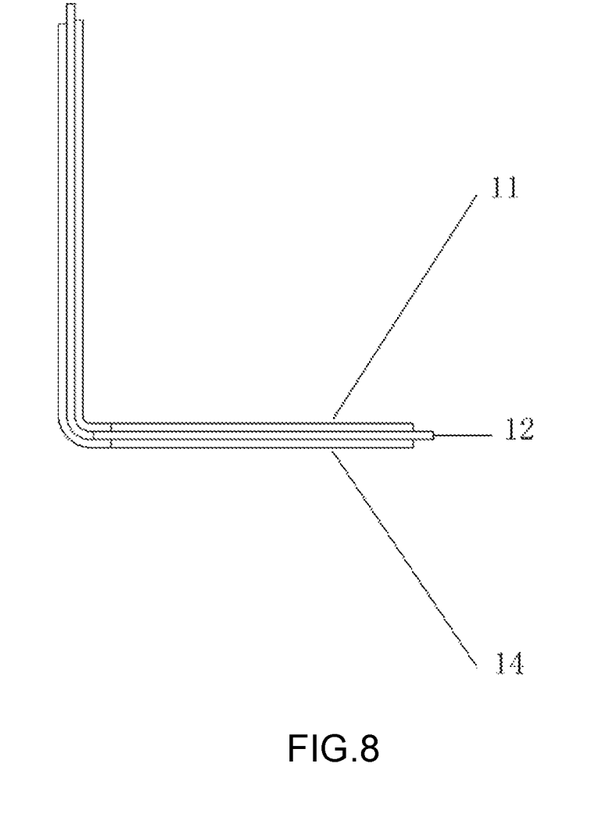
FIG. 8 is a structural diagram illustrating a double layer flexible circuit board of the present invention.
Figure 9:
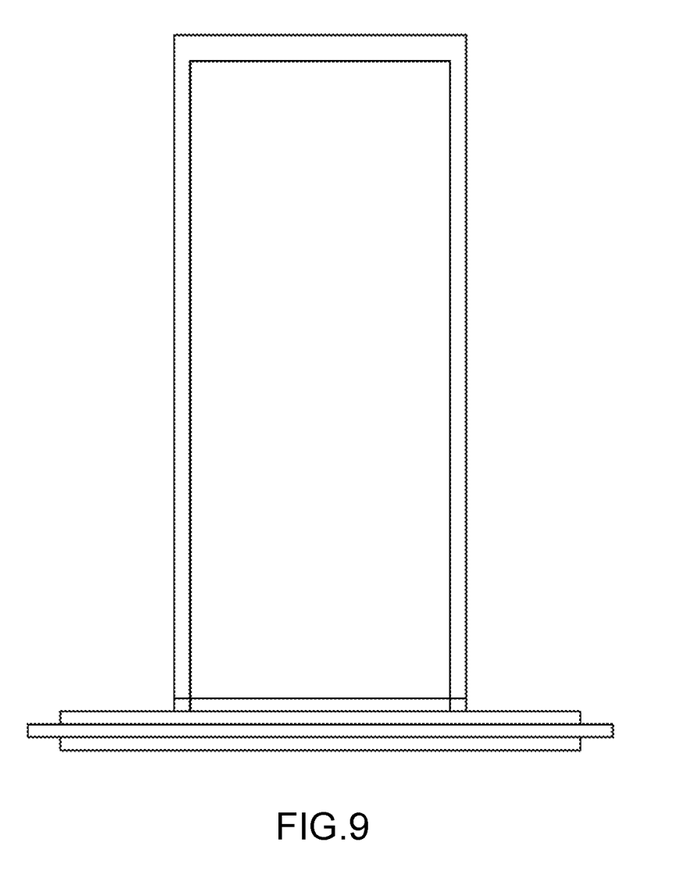
FIG. 9 is a right-side view of FIG. 8.
Figure 10:
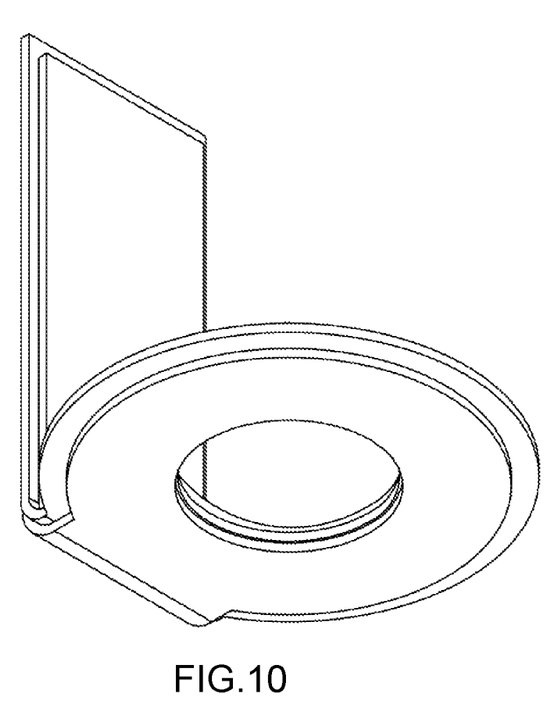
FIG. 10 is a structural diagram illustrating the double layer flexible circuit board of the present invention.
Figure 11:
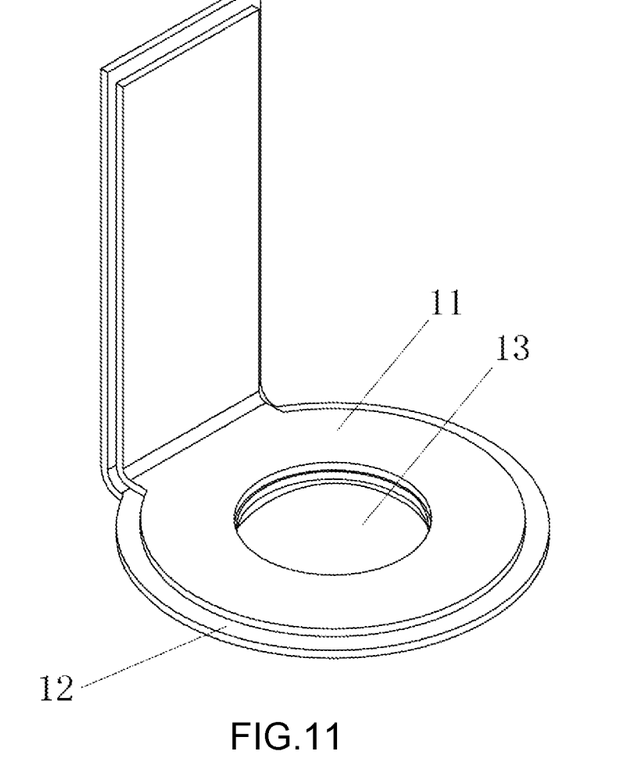
FIG. 11 is another structural diagram illustrating the double layer flexible circuit board of the present invention.
Figure 12:
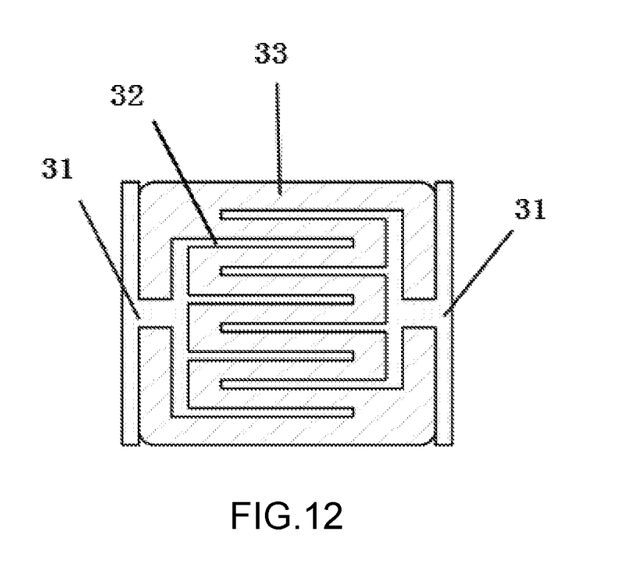
FIG. 12 is a structural diagram illustrating a multi-layer ceramic capacitor of the present invention.

According to an embodiment of the present invention, two external electrodes 31 are employed as shown in FIG. 12. The two external electrodes 31 are respectively positioned at two lateral sides of the multi-layer ceramic capacitor 3, and are respectively connected to internal electrode layers 32. The internal electrode layers 32 are positioned inside the ceramic dielectric 33 in an interlacing manner. The two external electrodes 31 can be either used as the output electrodes of the capacitance-variable pressure sensor or connected as a whole serving as the output electrode of the capacitance-variable pressure sensor.

According to an embodiment of the present invention, the double layer flexible circuit board 1 has a thickness around 0.13 mm.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A capacitance-variable pressure sensor for electronic pen, comprising:
   a double layer flexible circuit board, the double layer flexible circuit board being configured with a through hole or a notch;
   a multi-layer ceramic capacitor, comprising:
   a first member comprising an external electrode or a plurality of external electrodes; and
   a second member comprising:
   a ceramic dielectric; and
   a plurality of internal electrode layers disposed inside the ceramic dielectric in an interlacing manner,
   wherein each external electrode is connected to internal electrode layers; and
   a deformable conductive pad, positioned in adjacent to the multi-layer ceramic capacitor;
   wherein the double layer flexible circuit board is positioned between the multi-layer ceramic capacitor and the deformable conductive pad, Wherein the multi-layer ceramic capacitor is positioned above the through bole or notch, and the deformable conductive pad is positioned under the through hole or notch,
   wherein a pressure application member is adopted for applying an external pressure on the deformable conductive pad
   wherein when the external pressure is applied, the deformable conductive pad deforms so that at least a part of the deformable conductive pad moves toward the through hole or notch to contact the ceramic dielectric, and when the external pressure varies, the contact area of the deformable conductive pad with the ceramic dielectric varies accordingly, thus the capacitance between the deformable conductive pad and the external electrode(s) of the multi-layer ceramic capacitor varies accordingly.

2. The capacitance-variable pressure sensor of claim 1, wherein the double layer flexible circuit board comprises an upper conductive layer, a lower conductive layer, and an insulation layer disposed between and insulating the upper conductive layer and the lower conductive layer.

3. The capacitance-variable pressure sensor of claim 2, wherein the external electrode(s) of the multi-layer ceramic capacitor is/are electrically connected to the upper conductive layer.

4. The capacitance-variable pressure sensor of claim 2, wherein when applied with the external pressure, the deformable conductive pad is flexibly deformed and electrically connected to the lower conductive layer.

5. The capacitance-variable pressure sensor of claim 2, wherein the through hole or the notch is configured penetrating through the upper conductive layer, the insulation layer, and the lower conductive layer.

6. The capacitance-variable pressure sensor of claim 1, wherein the double layer flexible circuit board is configured with an L-shape cross-section.

7. The capacitance-variable pressure sensor of claim 1, wherein the pressure application member is configured with a bump and the bump is adopted for physically applying the external pressure on the deformable conductive pad.

8. The capacitance-variable pressure sensor of claim 1, wherein the double layer flexible circuit board is electrically connected to a measuring circuit.

9. The capacitance-variable pressure sensor of claim 1 wherein the multi-layer ceramic capacitor comprises two external electrodes respectively positioned at two lateral sides of the ceramic dielectric.

10. The capacitance-variable pressure sensor of claim 9, wherein the internal electrode layers respectively connected with the two external electrodes are disposed in an interlacing manner inside the ceramic dielectric.

11. The capacitance-variable pressure sensor of claim 1, wherein the through hole or notch penetrates the flexible circuit board to form an air gap which is sandwiched between the deformable conductive pad and the ceramic dielectric.

12. An electronic pen with capacitance-variable pressure sensor, including:
- a flexible circuit board being configured with a through hole or a notch;
- a multi-layer ceramic capacitor, comprising:
- a first member comprising an external electrode or a plurality of external electrodes; and
- a second member comprising:
- a ceramic dielectric; and
- a plurality of internal electrode layers disposed inside the ceramic dielectric in an interlacing manner,
- wherein each external electrode is connected to internal electrode layers; and
- a deformable conductive pad, positioned in adjacent to the multi-layer ceramic capacitor;
- wherein the flexible circuit board is sandwiched between the multi-layer ceramic capacitor and the deformable conductive pad;
- wherein a pressure application member is adopted for applying external pressure on the deformable conductive pad;
- wherein when the external pressure is applied, the deformable conductive pad deforms so that at least a part of the deformable conductive pad moves toward the through hole or notch to contact the ceramic dielectric, and when the external pressure varies, the contact area of the deformable conductive pad with the ceramic dielectric varies accordingly, thus the capacitance between the deformable conductive pad and the external electrode(s) of the multi-layer ceramic capacitor varies accordingly.

13. The electronic pen with capacitance-variable pressure sensor as claimed in claim 12, wherein the pressure application member is configured with a bump and the bump is adopted for physically applying the external pressure on the deformable conductive pad.

14. The electronic pen with capacitance-variable pressure sensor as claimed in claim 12, wherein the through hole or notch penetrates the flexible circuit board to form an air gap which is sandwiched between the deformable conductive pad and the ceramic dielectric.

\* \* \* \* \*